United States Patent Office 3,296,012
Patented Jan. 3, 1967

3,296,012
ELECTROLESS COPPER PLATING ON CERAMIC MATERIAL

Stewart G. Stalnecker, Jr., Raleigh, N.C., assignor to Corning Glass Works, Corning, N.Y., a corporation of New York No Drawing. Continuation of application Ser. No. 170,832, Feb. 2, 1962. This application Apr. 30, 1965, Ser. No. 452,333
6 Claims. (Cl. 117—47)

This application is a continuation of application Serial No. 170,832, filed February 2, 1962, now abandoned.

This invention relates to improvements in electroless plating or chemical deposition of copper on vitreous ceramic surfaces.

In applications such as, for example, terminating resistors comprising an electroconductive film formed on a ceramic substrate, it has been found that adhesion of copper deposited by heretofore known electroless or chemical deposition methods is poor. In addition, prior art methods enabled the deposition of only very thin layers of copper which made poor electrical contact to metallic or metallic oxide electroconductive films. The solderability of such layers was also poor. Furthermore, prior art plating solutions resulted in low copper yields because the solutions became rapidly exhausted.

It is the specific object of this invention to provide an improved method for electroless plating or chemical deposition of copper on ceramic substrates which will overcome the above disadvantages.

It is another object of this invention to provide a method for electroless plating of copper on ceramic material where the deposited copper is firmly adhered to the surface.

A further object is to provide a method for electroless copper plating whereby a comparatively thick layer of copper is deposited.

Still another object is to provide a method for electroless copper plating where the deposited copper makes good electrical contact with metallic or metallic oxide electroconductive films.

A still further object is to provide an electroless copper plating solution which has a comparatively long life.

Still another object is to provide an improved method for electroless plating or chemical deposition of copper for economic resistor termination.

Additional objects, features and advantages of the present invention will become apparent, to those skilled in the art, from the following detailed description.

I have found that poor adhesion of copper films produced on ceramic surfaces according to the prior methods is due to poor bonding of the metal to the ceramic caused by the lack of an effective anchorage in the surface of the ceramic. To obtain a sufficiently strong anchorage, I have discovered that, instead of being merely roughened or chemically etched, the surface of the ceramic must be leached so as to provide it with a submicroscopically porous surface.

Such leaching is accomplished in accordance with the invention by boiling the substrate in a suitable acid. The preferred acids vary with the substrate material, for example, orthophosphoric acid is used with alumina, hydrofluoric acid is used with zircon, beryllia, steatite or silicate glass-ceramics such as described in U.S. Patents No. 2,920,971 and No. 2,968,578, and the like. A silicate glass-ceramic, as used herein and as defined by the hereinabove noted patents, is a material consisting of a multiplicity of inorganic crystals dispersed in a glassy matrix where said crystals are formed by crystallization in situ from a glass consisting essentially of inorganic constituents of which the major constituent is silica, and where said glassy matrix consists essentially of the uncrystallized portion of the glass.

I have also found that poor solderability of copper films produced by the prior methods is due to not only the poor adhesion of such films, but also to the thinness of such films. It has been impossible to obtain comparatively thick copper films by employing conventional plating baths because the baths rapidly become exhausted due to the rapid recombination of copper ions and the subsequent precipitation of metallic copper in the bath, which results in the copper being unavailable for plating long before a suitably thick copper film can be desposited on the substrate. I have discovered that by adding a suitable sequestering or complexing agent to conventional plating bath solutions, recombination of copper ions can be significantly retarded, thereby preventing the precipitation of metallic copper in the plating bath and enabling substantially greater amounts of the copper in the bath to be available for plating for substantially greater periods of time.

In accordance with conventional electroless copper plating methods, a substrate is suitably cleaned and then sensitized by successive immersions in an aqueous solution of catalytic metal and an aqueous solution of a reducing agent such as, for example, solutions of cupric ammonium hydroxide and sodium borohydride, or the like, and rinsing in water following each such immersion. Thereafter, the substrate is immersed in the plating bath comprising, for example, an aqueous solution containing a salt of copper and an alkali metal hydroxide in presence of salts such as potassium sodium tartrate, and/or sodium carbonate. After immersion for a period of about 15 to 30 minutes the bath is substantially exhausted and a film of copper ranging from about 0.000005 inch to about 0.00002 inch in thickness has been deposited on the substrate.

The instant invention may be carried out using any conventional electroless copper plating bath solution. An example of one suitable bath is as follows. A concentrate is prepared comprising 79 g. potassium sodium tartrate, 28 g. copper sulfate, 20 g. sodium hydroxide and 32 g. sodium carbonate per liter of distilled water. The plating bath is then prepared by mixing by volume 2 parts of said concentrate with 1 part distilled water and adding 1–6 cc. formaldehyde per 100 cc. of said concentrate.

A typical example of carrying out the method of this invention is illustrated by the following. A 5⁄16 inch square substrate of hot pressed alumina having a thickness of about 0.010 inch was suitably cleaned by dipping in an ultrasonically agitated acetone bath. The alumina substrate was then placed in a leaching bath of boiling 85% ortho-phosphoric acid and allowed to boil for about 3 minutes. It has been found that leaching is satisfactorily accomplished if the ceramic is maintained in the leaching bath for a period ranging from at least 1 minute to about 5 minutes, although leaching for longer periods is possible if any partial preplating or precoating of the substrate is not thereby adversely affected. The device was then rinsed in water, placed in a solution of about 5% hydrogen peroxide for about 5 minutes, then boiled in water for about 10 minutes and thereafter air dried.

The alumina substrate was then sensitized by immersing in a 3.0% stannous chloride solution for about 3 minutes, rinsing in water, immersing in a 0.01% palladium chloride solution for about 3 minutes and finally thoroughly rinsing in water.

A conventional electroless copper plating bath such as hereinabove described was prepared to which was added a sequestering or complexing agent, tetrasodium salt of ethylenediaminetetraacetic acid in the amount of 2 parts per 100 parts by volume of the plating bath concentrate. It has been found that satisfactory results may be obtained if the sequestering or complexing agent is added to the plating bath in amounts ranging from about 1 part to 10 parts by volume per 100 parts of the plating bath concentrate, or at least 0.5% by volume of the plating bath.

The alumina substrate was placed in the plating bath containing the sequestering or complexing agent and maintained therein for about 3 hours. It was found that a well adhered copper coating of about 0.00075 inch thickness was deposited upon the alumina. It was also found that this copper coating was readily solderable.

Copper may also be selectively deposited on a substrate by the method of this invention. In applications such as resistor termination where an electroconductive coating resistance element is formed on a substrate, the herein described method may be used for forming said resistor termination by suitably masking the portions of the resistance device where the copper plating is not wanted.

Although the present invention has been described with respect to specific details of certain embodiments thereof, it is not intended that such details be limitations upon the scope of the invention except insofar as set forth in the following claims.

I claim:

1. In a method of chemically depositing copper on a surface of an alumina substrate comprising the steps of cleaning said substrate, sensitizing it, rinsing it with water and immersing it in a plating bath, the improvement comprising the steps of
   making the surface of said alumina substrate submicroscopically porous by leaching after said cleaning step in a bath comprising about 85% aqueous solution of ortho-phosphoric acid,
   sensitizing the leached surface by successively immersing said substrate in an aqueous solution of stannous chloride and an aqueous solution of palladium chloride for about 3 minutes each, and then
   immersing said substrate in a plating bath containing a salt of copper to which bath tetrasodium salt of ethylenediaminetetraacetic acid has been added in the amount of at least 0.5% by volume.

2. The method of chemically depositing a strongly adherent layer of copper on the surface of a ceramic substrate comprising the steps of
   forming a submicroscopically porous surface on said substrate by leaching in an acid bath for at least 1 minute,
   rinsing the leached surface with water,
   sensitizing the leached surface by successively immersing said substrate in an aqueous solution of catalytic metal and an aqueous solution of a reducing agent for about 3 minutes each,
   rinsing said substrate with water, and thereafter
   immersing said substrate in a plating bath containing a salt of copper to which bath tetrasodium salt of ethylenediaminetetraacetic acid has been added in the amount of at least 0.5% by volume.

3. An article having copper deposited on at least part of its surface by the method of claim 2.

4. The method of chemically depositing a strongly adherent layer of copper having a thickness of at least 0.00002 inch on the surface of a ceramic substrate comprising the steps of
   forming a submicroscopically porous surface on said substrate by leaching in an acid bath for at least 1 minute,
   rinsing said substrate with water,
   placing said substrate in a solution of 5% hydrogen peroxide for about 5 minutes,
   boiling said substrate in water,
   air drying said substrate,
   sensitizing the leached surface by successively immersing said substrate in an aqueous solution of stannous chloride and an aqueous solution of palladium chloride for about 3 minutes each, rinsing said substrate with water, and thereafter
   immersing said substrate in a plating bath comprising an aqueous solution of a salt of copper, an alkali metal hydroxide and tetrasodium salt of ethylenediaminetetraacetic acid for at least 20 minutes, said tetrasodium salt being present in an amount effective to retard precipitation of metallic copper in said plating bath.

5. The method of chemically depositing a strongly adherent layer of copper having a thickness of at least 0.00002 inch on the surface of an alumina substrate comprising the steps of
   forming a submicroscopically porous surface on said substrate by leaching in an 85% aqueous solution of ortho-phosphoric acid for at least 1 minute,
   rinsing said substrate with water,
   placing said substrate in a solution of 5% hydrogen peroxide for about 5 minutes,
   boiling said substrate in water,
   air drying said substrate,
   sensitizing the leached surface by successively immersing said substrate in an aqueous solution of stannous chloride and an aqueous solution of palladium chloride for about 3 minutes each,
   rinsing said substrate with water, and thereafter
   immersing it in a plating bath comprising an aqueous solution of a salt of copper, an alkali metal hydroxide and tetrasodium salt of ethylenediaminetetraacetic acid for at least 20 minutes, said tetrasodium salt being present in the amount of at least 0.5% by volume.

6. The method of chemically depositing a strongly adherent layer of copper having a thickness of at least 0.00002 inch on the surface of a silicate glass-ceramic substrate comprising the steps of
   forming a submicroscopically porous surface on said substrate by leaching in an aqueous solution of hydrofluoric acid for at least 1 minute,
   rinsing said substrate with water,
   placing said substrate in a solution of 5% hydrogen peroxide for about 5 minutes,
   boiling said substrate in water,
   air drying said substrate,
   sensitizing the leached surface by successively immersing said substrate in an aqueous solution of stannous chloride and an aqueous solution of palladium chloride for about 3 minutes each,
   rinsing said substrate with water, and thereafter
   immersing said substrate in a plating bath comprising an aqueous solution of a salt of copper, an alkali meal hydroxide and tetrasodium salt of ethylenediaminetetraacetic acid for at least 20 minutes, said tetrasodium salt being present in the amount of at least 0.5% by volume.

References Cited by the Examiner

UNITED STATES PATENTS

| | | | |
|---|---|---|---|
| 2,690,402 | 9/1954 | Crehan | 117—54 X |
| 2,872,312 | 2/1959 | Eisenberg | 117—160 |
| 2,956,901 | 10/1960 | Carlson | 117—160 X |
| 2,968,578 | 1/1961 | Mochel | 117—54 |
| 3,042,566 | 7/1962 | Hardy | 156—2 |
| 3,075,856 | 1/1963 | Lukes | 117—47 |
| 3,093,509 | 6/1963 | Wein | 117—160 |
| 3,095,309 | 6/1963 | Zeblisky et al. | 117—130 |
| 3,119,709 | 1/1964 | Atkinson | 117—47 |

FOREIGN PATENTS

| | | |
|---|---|---|
| 45,696 | 9/1952 | India. |

ALFRED L. LEAVITT, *Primary Examiner.*

RALPH S. KENDALL, *Examiner.*